United States Patent [19]
Maeda et al.

[11] Patent Number: 5,672,894
[45] Date of Patent: Sep. 30, 1997

[54] SEMICONDUCTOR DEVICE

[75] Inventors: Hiroshi Maeda, Reutlingen, Germany; Susumu Ueda, Nukata-gun, Japan; Hiroshi Fujimoto, Nagoya, Japan; Yoshiaki Nakayama, Nukata-gun, Japan

[73] Assignee: Nippondenso Co., Ltd., Kariya, Japan

[21] Appl. No.: 543,864

[22] Filed: Oct. 19, 1995

[30] Foreign Application Priority Data

Oct. 20, 1994 [JP] Japan ..................... 6-255266

[51] Int. Cl.⁶ ............... H01L 29/76; H01L 29/94; H01L 31/062; H01L 31/113
[52] U.S. Cl. ............... 257/343; 257/335; 257/341; 257/342
[58] Field of Search ............... 257/335, 341, 257/342, 343

[56] References Cited

U.S. PATENT DOCUMENTS

| | | | |
|---|---|---|---|
| 4,636,825 | 1/1987 | Baynes | 257/343 |
| 4,890,142 | 12/1989 | Tonnel et al. | 257/343 |
| 4,949,139 | 8/1990 | Korsh et al. | 257/343 |
| 5,412,239 | 5/1995 | Williams | 257/343 |

FOREIGN PATENT DOCUMENTS

| | | | |
|---|---|---|---|
| 2-268467 | 11/1990 | Japan | 257/343 |
| 3-239369 | 10/1991 | Japan | 257/343 |

*Primary Examiner*—Steven H. Loke
*Attorney, Agent, or Firm*—Cushman, Darby & Cushman IP Group of Pillsbury Madison & Sutro LLP

[57] ABSTRACT

The resistance to electromigration in a double-layer Al wiring structure of lateral DMOS or the like is improved by further reducing ON resistance and mitigating current concentration. The first-layer source wiring and the first-layer drain wiring which are electrically connected to a plurality of source cells and drain cells respectively are formed into a pectinate pattern respectively. The second-layer source wiring and the second-layer drain wiring are also formed into a pectinate pattern respectively and disposed in inclination at 45 degrees to the patterns of the first-layer source wiring and first-layer drain wiring. At the intersections of the first-layer source wiring and the second-layer source wiring, at the intersections of the first-layer drain wiring and the second-layer drain wiring, at the outer circumferential portions of the pectinate patterns of first-layer source and drain wirings and at the source and drain pads, contact holes are provided on a layer insulation film to make a contact between the first-layer source and drain wirings and the second-layer source and drain wirings, respectively.

16 Claims, 6 Drawing Sheets

SEMICONDUCTOR DEVICE

CROSS REFERENCE TO RELATED APPLICATION

This application is based upon and claims the benefit of priority of the prior Japanese Patent application No. 6-255266 filed on Oct. 20, 1994, the contents of which are incorporated herein by reference.

BACKGROUND OF THE INVENTION

1. Field of the Invention:

The present invention generally relates to a semiconductor device, and more particularly to a semiconductor device including a lateral DMOS of double-layer electrode wiring structure.

2. Related Arts:

In a lateral DMOS (hereinafter referred to as "LDMOS"), a plurality of transistors are connected in parallel with each other to permit the flow of a large current. For this arrangement, the LDMOS includes a plurality of source regions and drain regions disposed in a mesh or in a grid on the same substrate of a semiconductor wafer. In order to mutually connect all the source regions and drain regions without short circuits, a single-layer Al wiring structure in a pectinate pattern or comb-teeth pattern like one illustrated in FIG. 5 has conventionally been used.

In FIG. 5, a plurality of source cells 1 and drain cells 2 are formed by being alternately disposed in a grid on the same substrate. On the surfaces of these source cells 1 and drain cells 2 is formed an insulating layer. On the insulating layer of all the source cells 1 and drain cells 2 are formed source contacts 3 and drain contacts 4. Through these source contacts 3 and drain contacts 4, a source wiring 5 and a drain wiring 6 are formed, both of which are formed in pectinate patterns. The reference numerals 7 and 8 denote a source pad and a drain pad, respectively.

Therefore, the plurality of source cells 1 and drain cells 2 are connected to the source wiring 5 and the drain wiring 6 through the source contacts 3 and the drain contacts 4, respectively, and further electrically connected to the source pad 7 and the drain pad 8, respectively.

In such LDMOS, it is common that the cell pitch is shortened in order to reduce the ON resistance per unit area. Here, in the single-layer Al wiring structure in a pectinate pattern as described above, when the cell pitch is shortened, the width of the Al wiring has to be narrowed accordingly, and this causes a problem that the resistance of the wiring itself becomes large.

Further, if the LDMOS is large in area, there is also a problem that a large current gathered from the plurality of cells concentrates in the narrow Al wiring in the vicinity of the pad, and this causes a problem of the occurrence of electromigration.

As a solution to these problems, there is a technique which uses a double-layer Al wiring structure.

For example, a technique publicized in the U.S. Pat. No. 4,636,825, the second-layer Al wiring is patterned in the same way as the first-layer Al wiring, and these two Al wirings are overlaid on top of another in order to reduce the wiring resistance. However, such technique as well, the width of the second-layer Al wiring has to unavoidably be narrowed as a result of the narrowing of the width of the first-layer Al wiring due to the shortage of the cell pitch. Therefore, the effect of the wiring resistance reduction by employing the double-layer Al wiring structure is not so large.

In a technique disclosed in the Japanese Unexamined Patent Publication No. 2-268467, as illustrated in FIG. 6, the wiring resistance is reduced by connecting the first-layer Al wirings 10 and 11 for sources and drains to the second-layer Al wirings 14 and 15 for sources and drains through via holes 12 and 13, respectively, and enlarging the areas of the second-layer Al wirings 14 and 15.

However, in the first-layer source wiring 10, a part 10a located under the second-layer drain wiring 15 has no via holes 12 which connect the first-layer source wiring 10 to the second-layer source wiring 14, and therefore a current flow passage therethrough is composed only of the first-layer source wiring 10. This is also the case with a part 11a in the first-layer drain wiring 11. For this reason, there is a problem with an LDMOS which is large in area that the effect of the double-layer Al wiring structure can not sufficiently be obtained.

SUMMARY OF THE INVENTION

In view of the above problems, it is an object of the present invention, relating to a semiconductor device where current laterally flows with respect to a surface of a semiconductor substrate, to improve the resistance to electromigration by further reducing the ON resistance and mitigating the current concentration.

In order to achieve the above objective, a semiconductor device according to the present invention includes: an array of first regions and second regions alternately disposed in a grid (checkerboard pattern) on a semiconductor substrate and forming current flow passages laterally to the surface of the semiconductor substrate; a first insulating layer formed over the array of first and second regions; a first-group first-layer wiring and a second-group first-layer wiring disposed on the first insulating layer and respectively connected to the first and second regions, each of which is formed into a pectinate pattern in such a way that first-group first-layer and second-group first-layer wirings engage with each other; a second insulating layer formed on both the first-group first-layer and second-group first-layer wirings; and a first-group second-layer wiring and a second-group second-layer wiring disposed on the second insulating layer and respectively connected to the first-group first-layer and second-group first-layer wirings, each of which is formed into a pectinate pattern in such a way that first-group second-layer and second-group second-layer wirings engage with each other and that the pectinate patterns of the first-group second-layer and second-group second-layer wirings make an inclined angle with the pectinate patterns of the first-group and second-group first-layer wirings, wherein the second insulating layer has first-group via holes connecting the first-group first-layer wiring with the first-group second-layer wiring at the intersections thereof and second-group via holes connecting the second-group first-layer wiring with the second-group second-layer wiring at the intersections thereof.

According to the present invention, a plurality of source cells and drain cells (first regions and second regions) are formed by being alternately disposed in a grid, and the wiring thereof is a double-layer wiring structure.

The first-layer source wiring (first-group first-layer wiring) and the first-layer drain wiring (second-group first-layer wiring) are formed into a pectinate pattern, respectively. The second-layer source wiring (first-group second-layer wiring) and the second-layer drain wiring (second-group second-layer wiring) are also formed into a pectinate pattern, respectively. Here, the pectinate wiring patterns for the respective first-layer source and drain wirings are disposed to form an inclined angle with respect to the pectinate wiring patterns for the second-layer source and drain wirings.

The first-layer source wiring and the second-layer source wiring are electrically connected to each other at the intersections thereof through the first-group via holes, and the first-layer drain wiring and the second-layer drain wiring are electrically connected to each other at the intersections thereof through the second-group via holes.

Therefore, by forming the pectinate patterns of the first-layer and second-layer wirings at a specified inclined angle to each other, the degree of freedom of the layout of the second-layer wiring increases and the resistance due to the second-layer wiring can be reduced.

Furthermore, as the first-layer wiring and the second-layer wiring are electrically connected to each other at the intersection thereof, the current in the first-layer wiring can directly be led out to the second-layer wiring. Therefore, compared with the prior art illustrated in FIG. 6, the current flow passage with the first-layer wiring alone can be shortened, and the resistance can further be reduced. Moreover, as the first-layer and second-layer wirings intersect each other in inclination to each other, via holes between the first-layer wiring and the second-layer wiring can be distributed freely and equally on both the source wiring side and the drain wiring side. This means the the width of the second-layer wiring can be set freely, which is advantageous to the promotion of resistance reduction.

In addition, if both the patterns of the first-layer and second-layer wirings are formed to extend to the pad portions, and the first-layer and second-layer contacts are also provided at the pad portions, the resistance at the pad portions where current density is high can be reduced.

Moreover, if the contacts between the first-layer and second-layer wirings are provided at the spine portions of the pectinate patterns at the outer circumferential portion of the first-layer wiring, the resistance at the outer circumferential portion where current density is high can be reduced.

Still furthermore, if the patterns of the second-layer source wiring and second-layer drain wiring are formed to be wider along with the extension thereof toward the source pad and the drain pad, the increase in current density toward the pad portions can be restrained and the resistance can be reduced.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

The present invention will now be described as to preferred embodiments illustrated in appended drawings.

Figure 1:
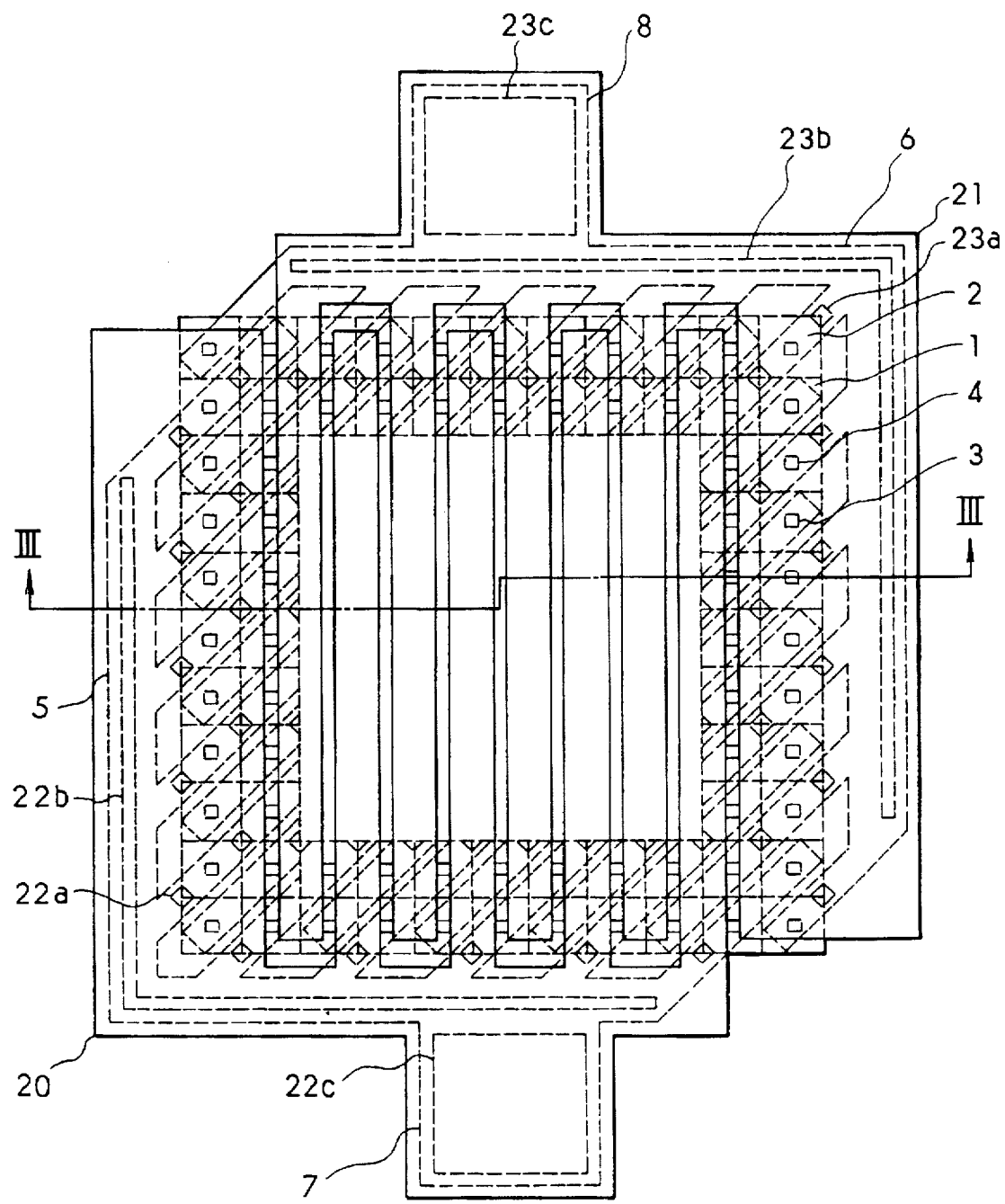
FIG. 1 is a plan view illustrating the double-layer Al wiring structure of an embodiment according to the present invention.

FIG. 1 illustrates a double-layer Al wiring structure as an embodiment according to the present invention. In this figure, hidden lines are omitted in the central square region.

Figure 2:
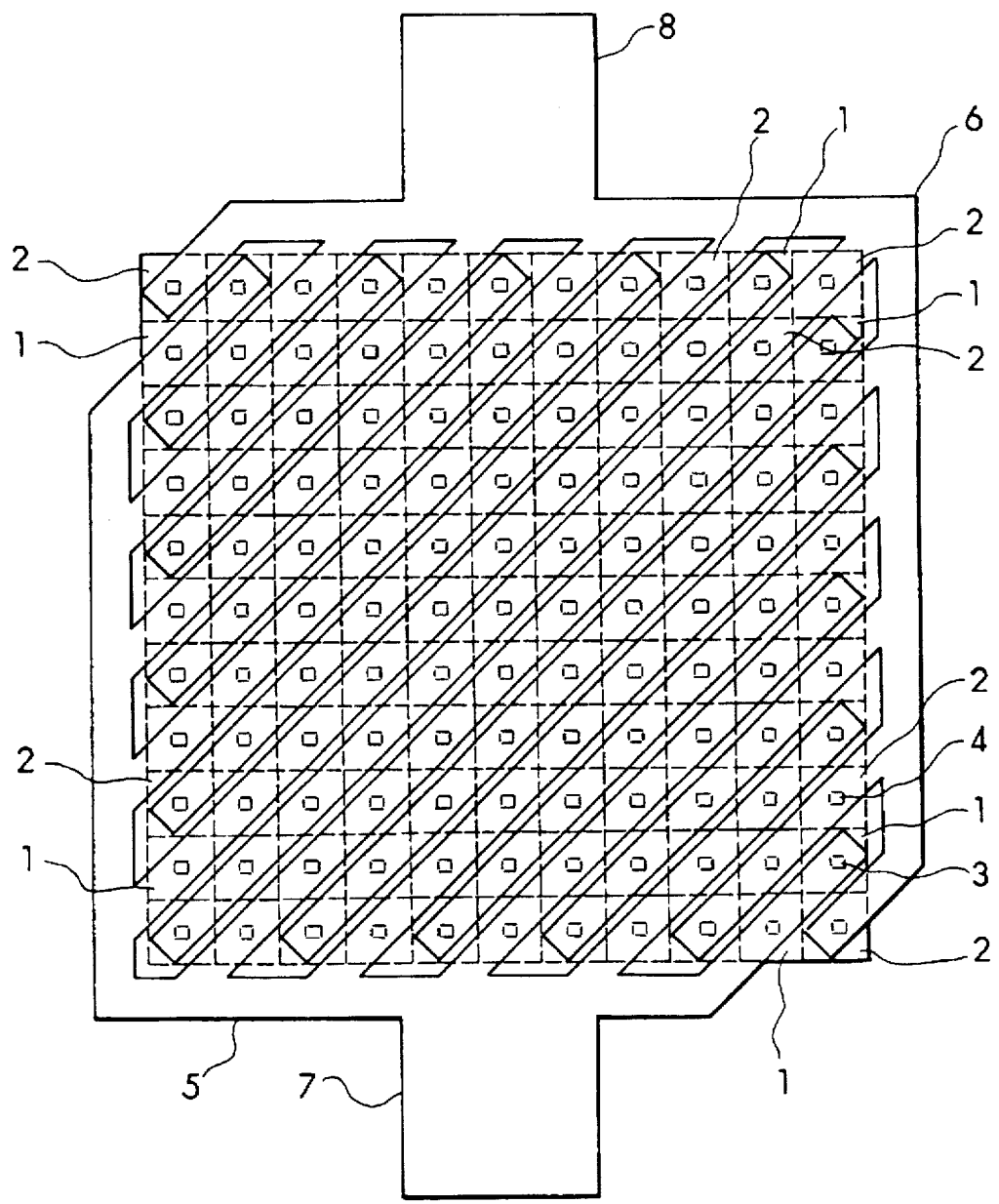
FIG. 2 is a plan view illustrating the Al wiring pattern of the first layer of the embodiment.
Figure 5:
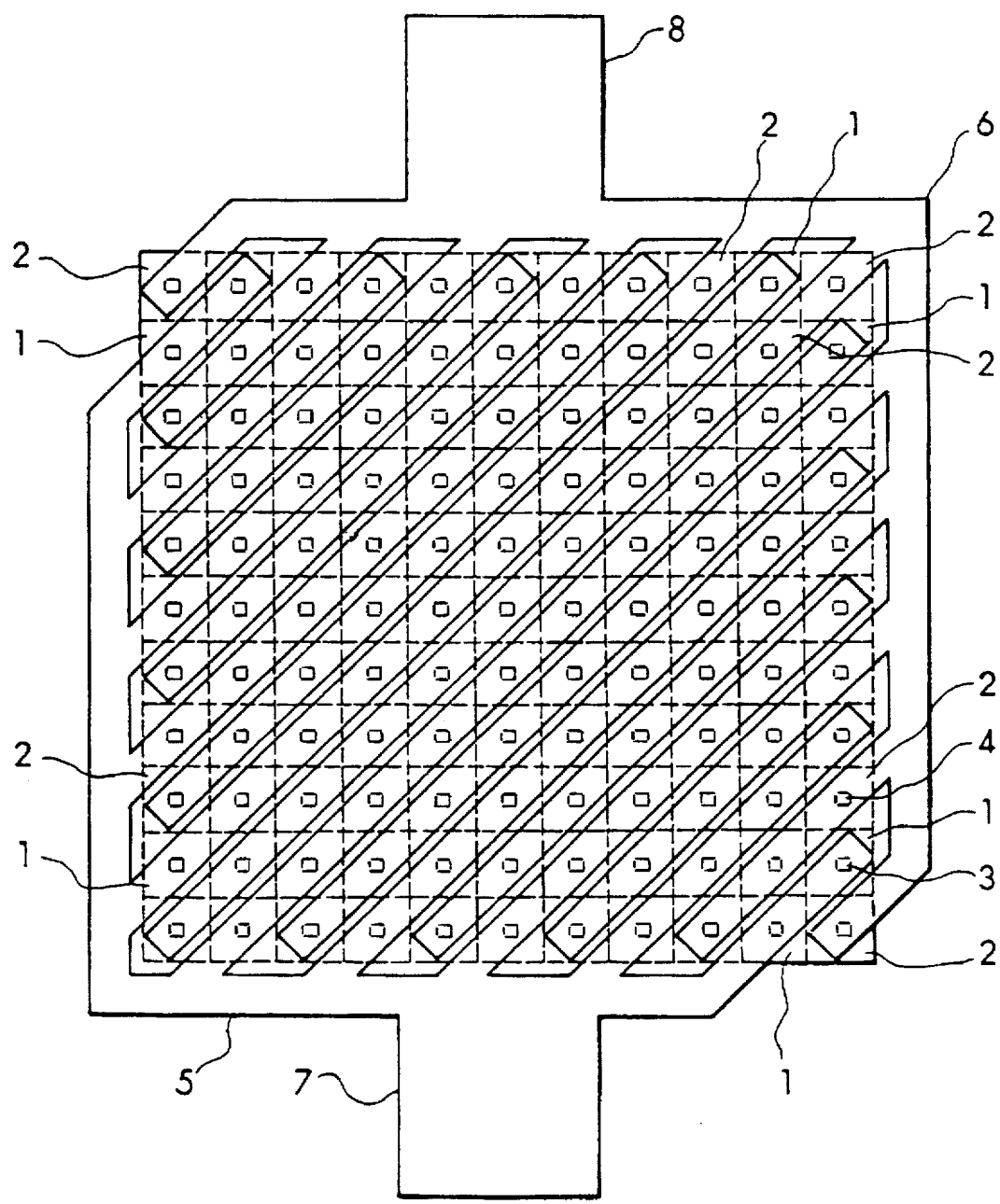
FIG. 5 is a plan view illustrating a conventional single-layer Al wiring structure.
Figure 6:
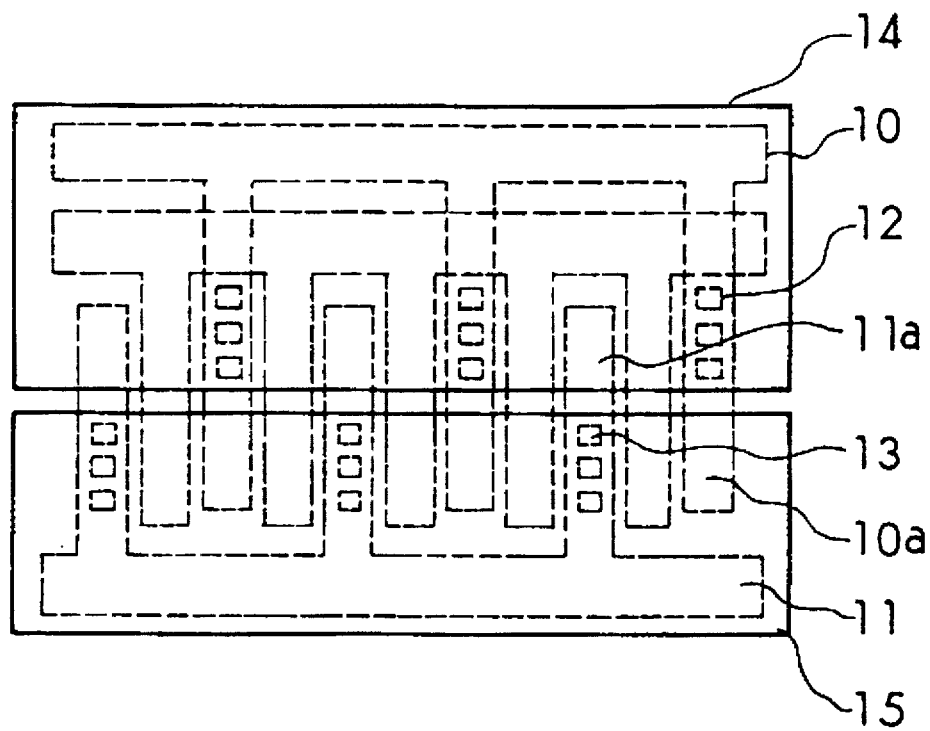
FIG. 6 is a plan view illustrating a conventional double-layer Al wiring structure.

In this embodiment, an Al wiring pattern of the first layer has a pattern construction as illustrated in FIG. 2. Here, as the pattern illustrated in FIG. 2 is the same as the pattern illustrated in FIG. 5, the detailed description of the pattern will be omitted here.

In FIG. 1, a second-layer source wiring 20 and a second-layer drain wiring 21 are formed on a first-layer Al wiring structure illustrated in FIG. 2 with an insulating layer interposed therebetween. As illustrated in FIG. 1, the second-layer source wiring 20 and the second-layer drain wiring 21 are formed into a pectinate pattern, inclined at 45 degrees to a first-layer source wiring 5 and a first-layer drain wiring 6 respectively. The respective pectinate patterns of the first-layer source wiring 5 and first-layer drain wiring 6 and the respective pectinate patterns of the second-layer source wiring 20 and second-layer drain wiring 21 are, as illustrated in FIG. 1, disposed to engage with each other.

On the insulating layer are formed source contacts (via holes) 22a and drain contacts (via holes) 23a to correspond to the intersections of the first-layer source wiring 5 and the second-layer source wiring 20 as well as the intersections of the first-layer drain wiring 6 and the second-layer drain wiring 21, respectively. Also, on the insulating layer on a source pad 7 and a drain pad 8 of the first-layer source and drain wirings, contacts (via holes) 22c and 23c are formed, respectively. In addition, at the outer circumferential portion of the first-layer source wiring 5, i.e., the left side and under side of the first-layer source wiring 5 in FIG. 1, a contact 22b between the first-layer source wiring 5 and the second-layer source wiring 20 is formed through a via hole provided on the insulating layer. Also, at the outer circumferential portion of the first-layer drain wiring 6, i.e., the right side and upper side of the first-layer drain wiring 6 in FIG. 1, a contact 23b between the first-layer drain wiring 6 and the second-layer drain wiring 21 is formed through a via hole provided on the insulating layer. These contacts 22a through 22c and 23a through 23c are provided by forming via holes on the insulating layer before depositing the second-layer Al wiring by means of vapor deposition. The outer circumferential portions are regions where source cells 1 and drain cells 2 are not formed. Therefore, the second-layer source wiring 20 and the second-layer drain wiring 21 are formed so as to be wider at these outer circumferential portions than the other wiring portions (or central portions of the pectinate patterns thereof).

In the above construction, the plurality of source cells 1 are electrically connected to the source pad 7 with the first-layer source wiring 5 and the second-layer source wiring 20 through the source contact 22a. In this case, current flowing through the source cells 1 located at a distance from the source pad 7 also flows through the first-layer source wiring 5, which is comparatively short, pulled into the second-layer wiring 20 which has a low resistance, and subsequently flows through the second-layer source wiring 20 up to the source pad 7. Therefore, it is possible to reduce the wiring resistance.

Furthermore, the contacts 22b and 22c enable connection of the first layer source wiring 5 and the second-layer source wiring 20 to not only to the cell region, i.e., the active region, but also to the outer circumferential portion of the first-layer source wiring 5, the source pad portion, and other connectable parts. Therefore, it is possible to further reduce the wiring resistance. That is, since the outer circumferential portion and the source pad portion are places in which current concentrates from the plurality of cells, it is possible to reduce the wiring resistance and mitigate the current concentration by enlarging the area of the second-layer source wiring 20.

Moreover, since the drain wirings are formed in symmetry with the source wirings, it is also possible to substantially reduce the wiring resistance of the drain wirings as well as the source wirings.

For the above reasons, the wiring resistance of the LDMOS having a large area can substantially be reduced down from the conventional counterparts. In addition, current flows up to the source pad 7 and the drain pad 8 through the respective second-layer Al wirings with no concentration of a large current in the first-layer Al wiring even though the wiring is narrow, improving the resistance to electromigration.

Now, the manufacturing method of the above double-layer Al wiring will be described referring to FIGS. 3A through 3E which are cross-sectional views taken along line III—III of FIG. 1.

Figure 3:
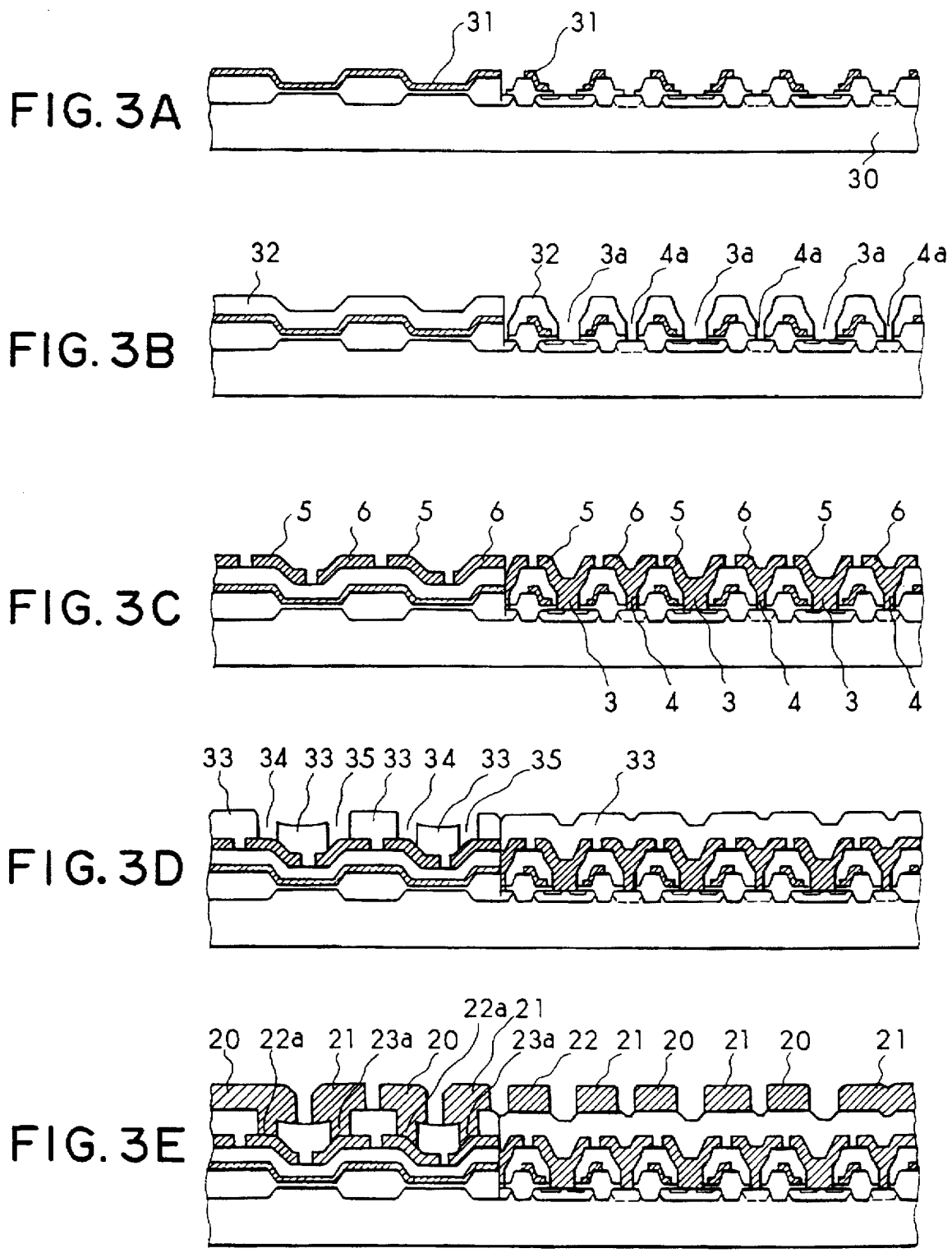
FIGS. 3A through 3E are process views illustrating the manufacturing method of the double-layer Al wiring structure of FIG. 1.

First of all, on a semiconductor substrate 30, the plurality of source cells and the plurality of drain cells are alternately disposed and further gate electrodes 31 are formed (FIG. 3A). After the formation of the first insulating layer 32, contact holes 3a and 4a for use in the formation of source contacts 3 and drain contacts 4, respectively, are made in the first insulating layer 32 on the plurality of source cells 1 and the plurality of drain cells 2 (FIG. 3B).

Then, aluminum is deposited by means of vapor deposition and is patterned to form the first-layer Al wiring, i.e., the first-layer source wiring 5 and the first-layer drain wiring 6, on the first insulating layer 32. During this process, the source contacts 3 and the drain contacts 4 are formed through the contact holes 3a and 4a, respectively. Furthermore, by the above patterning of the deposited aluminum, the respective pectinate wiring patterns, facing each other as illustrated in FIG. 2, of the first-layer source wiring 5 and the first-layer drain wiring 6 are formed (FIG. 3C).

Next, the second insulating layer 33 is formed over the semiconductor wafer. Then, in the second insulating layer 33, via holes 34 are formed at portions where the second-layer source wiring 20 (formed in the next step) and the first-layer source wiring 5 would intersect each other, and via holes 35 are also formed at portions where the second-layer drain wiring 21 (formed in the next step) and the first-layer drain wiring 6 would intersect each other. The via holes 34 and 35 are simultaneously formed for use in the formation of the source contacts 22a and the drain contacts 23a, respectively (FIG. 3D). In addition, via holes (not illustrated in FIG. 3D) for use in the formation of the contacts 22b and 23b at the outer circumferential portions and the contacts 22c and 23c at the pad portions are also respectively made simultaneously.

Then, over the second insulating layer 33, aluminum for the second-layer wiring is deposited by vapor deposition. During this process, the contacts 22a through 22c and 23a through 23c are formed in through the via holes 34, 35 formed the preceding step. Furthermore, the deposited aluminum for the second-layer wiring is etched to be patterned into a pectinate pattern inclined at 45 degrees with respect to the first-layer Al wiring to thereby form the second-layer source wiring 20 and the second-layer drain wiring 21 (FIG. 3E). The second-layer source wiring 20 and the second-layer drain wiring 21 are formed in pectinate wiring patterns which engage with each other.

In the above way, the double-layer Al wiring structure illustrated in FIG. 1 is formed.

Figure 4:
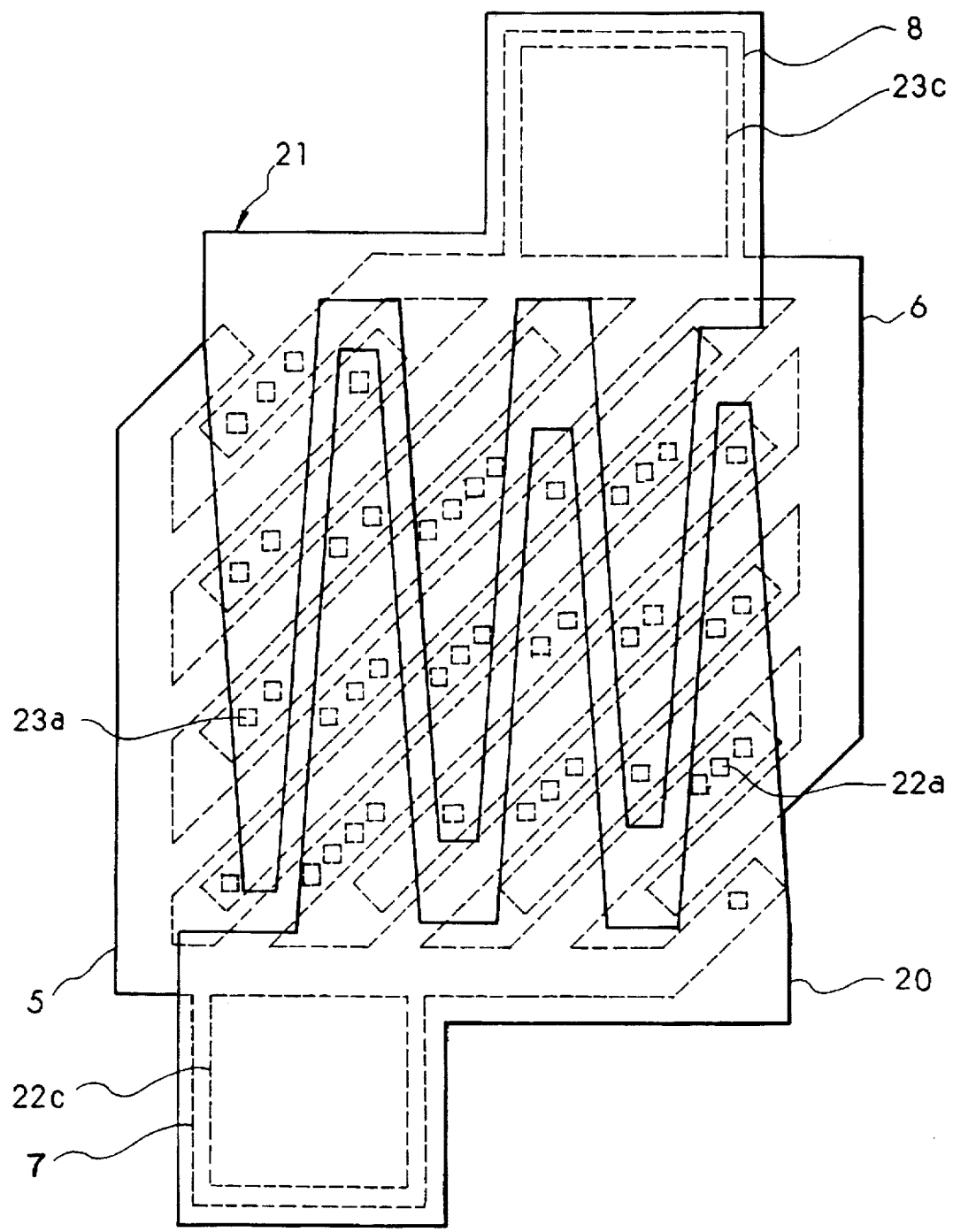
FIG. 4 is a plan view illustrating the double-layer Al wiring structure of another embodiment according to the present invention.

In the above embodiment, the layers are constructed so that the second-layer source wiring 20 and the second-layer drain wiring 21 have pectinate patterns where the width of all the teeth is equal and remains constant. However, as illustrated in FIG. 4, it may be so constructed that the second-layer source wiring 20 and the second-layer drain wiring 21 may become wider toward the pads 7 and 8. By shaping the pectinate pattern of the second-layer source wiring 20 and second-layer drain wiring 21, current concentration near the pads 7 and 8 can be mitigated and the resistance to electromigration can be optimized.

Also, in the above embodiment, the pattern of the second-layer Al wiring is formed in inclination at 45 degrees to the pattern of the first-layer Al wiring. However, this angle may be changed to, for example, 90 degrees.

Furthermore, in addition to LDMOS, the present invention may also be applied to a power type bipolar transistor and other semiconductor element through which current flows laterally with respect to the surface of the semiconductor substrate. In such an application, the emitter region and collector region of the power type bipolar transistor correspond to the first region and second region of the present invention, respectively.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device, comprising:

a semiconductor substrate having a surface;

an array of semiconductor elements arranged in a plurality of columns and rows, said semiconductor elements including a plurality of first regions and second regions which are alternately disposed along each of said plurality of columns and rows to form current flow passages laterally with respect to said surface of said semiconductor substrate;

a first insulating layer formed on said surface of said semiconductor substrate to cover said plurality of first regions and second regions;

a first-group first-layer wiring located on said first insulating layer and formed into a first pectinate pattern having first tooth portions and a first connecting portion to connect said first tooth portions, said first-group first-layer wiring being electrically connected to said plurality of first regions;

a second-group first-layer wiring located on said first insulating layer and formed into a second pectinate pattern having second tooth portions and a second connecting portion to connect said second tooth portions, said second-group first-layer wiring being electrically connected to said plurality of second regions, said first-group first-layer wiring and said second-group first-layer wiring making a first layer wiring pattern in which said first tooth portions of said first pectinate pattern and said second tooth portions of said second pectinate pattern are interleaved;

a second insulating layer formed on said first layer wiring pattern to cover said first-group first-layer wiring and said second-group first-layer wiring, said second insulating layer having first-group holes, second-group holes, and first and second peripheral holes, said first and second peripheral holes being arranged outside an area where said array of semiconductor elements is formed;

a first-group second-layer wiring located on said second insulating layer and formed into a third pectinate pattern having third tooth portions and a third connecting portion to connect said third tooth portions; and a second-group second-layer wiring located on said second insulating layer and formed into a fourth pectinate pattern having fourth tooth portions and a fourth connecting portion to connect said fourth tooth portions, said second-group first layer wiring and said second-group second-layer wiring making a second layer wiring pattern in which said third tooth portions of said third pectinate pattern and said fourth tooth portions of said fourth pectinate pattern are interleaved, said second layer wiring pattern being formed at a specified angle with respect to said first layer wiring pattern, wherein said first-group second-layer wiring is electrically connected to said first-group first-layer wiring via said first group holes, which are formed in said second insulating layer where said first tooth portions of said first pectinate pattern intersect said third tooth portions of said third pectinate pattern, and said first peripheral hole formed in said second insulating layer so that said first connecting portion of said first pectinate pattern is electrically connected to said third connecting portion of said third pectinate pattern outside said area where said array of semiconductor elements is formed, and said second-group second-layer wiring is electrically connected to said second-group first-layer wiring via said second group holes, which are formed in said second insulating layer where said second tooth portions of said second pectinate pattern intersect said fourth tooth portions of said fourth pectinate pattern, and said second peripheral hole formed in said second insulating layer so that said second connecting portion of said second pectinate pattern is electrically connected to said fourth connecting portion of said fourth pectinate pattern outside said area where said array of semiconductor elements is formed.

2. The semiconductor device of claim 1, wherein the specified angle made by the first-layer wiring pattern and the second-layer wiring pattern is 45 degrees.

3. A semiconductor device according to claim 1, wherein said first peripheral hole is formed along a periphery of each of said connecting portions of said first and third pectinate patterns.

4. A semiconductor device according to claim 3, wherein said second peripheral hole is formed along a periphery of each of said connecting portions of said second and fourth pectinate patterns.

5. A semiconductor device according to claim 1, wherein said tooth portions of said third and fourth pectinate patterns are formed into shapes in which a width of each of said tooth portions becomes wider toward its respective connecting portion.

6. A semiconductor device, comprising:

a semiconductor substrate having a surface;

an array of semiconductor elements arranged in a plurality of columns and rows, said semiconductor elements including a plurality of first regions and second regions which are alternately disposed along each of said plurality of columns and rows to form current flow passages laterally with respect to said surface of said semiconductor substrate;

a first insulating layer formed on said surface of said semiconductor substrate to cover said plurality of first regions and second regions;

a first-group first-layer wiring located on said first insulating layer and formed into a first pectinate pattern having first tooth portions, a first connecting portion to connect said first tooth portions, and a first pad portion as a terminal which extends from said first connecting portion, said first-group first-layer wiring being electrically connected to said plurality of first regions;

a second-group first-layer wiring located on said first insulating layer and formed into a second pectinate pattern having second tooth portions, a second connecting portion to connect said second tooth portions, and a second pad portion as a terminal which extends from said second connecting portion of said second pectinate pattern, said second-group first-layer wiring being electrically connected to said plurality of second regions, said first-group first-layer wiring and said second-group first-layer wiring making a first layer wiring pattern in which said first tooth portions of said first pectinate pattern and said second tooth portions of said second pectinate pattern are interleaved;

a second insulating layer formed on said first layer wiring pattern to cover said first-group first-layer wiring and said second-group first-layer wiring, said second insulating layer having first-group holes, second-group holes, and first and second pad holes;

a first-group second-layer wiring located on said second insulating layer and formed into a third pectinate pattern having third tooth portions, a third connecting portion to connect said third tooth portions, and a third pad portion as a terminal which extends from said third connecting portion of said third pectinate pattern; and a second-group second-layer wiring located on said second insulating layer, formed into a fourth pectinate pattern having fourth tooth portions, a fourth connecting portion to connect said fourth tooth portions and a fourth pad portion as a terminal which extends from said fourth connecting portion of said fourth pectinate pattern, said second-group first layer wiring and said second-group second-layer wiring making a second layer wiring pattern in which said third tooth portions of said third pectinate pattern and said fourth tooth portions of said fourth pectinate pattern are interleaved, said second layer wiring pattern being formed at a specified angle with respect to said first layer wiring pattern, wherein said first-group second-layer wiring is electrically connected to said first-group first-layer wiring via said first group holes, which are formed in said second insulating layer at intersections where said first tooth portions of said first pectinate pattern intersect said third tooth portions of said third pectinate pattern, and said first pad hole formed in said second insulating layer at a position where said third pad portion of said third pectinate pattern overlaps with said first pad portion of said first pectinate pattern, and said second-group second-layer wiring is electrically connected to said second-group first-layer wiring via said second group holes, which are formed in said second insulating layer at intersections where said second tooth portions of said second pectinate pattern intersect said fourth tooth portions of said fourth pectinate pattern, and said second pad hole formed in said second insulating layer at a position where said fourth pad portion of said fourth pectinate pattern overlaps with said second pad portion of said second pectinate pattern.

7. The semiconductor device of claim 6, wherein the specified angle made by the first-layer wiring pattern and the second-layer wiring pattern is 45 degrees.

8. A semiconductor device according to claim 6, wherein said tooth portions of said third and fourth pectinate patterns are formed into shapes in which a width of each of said tooth portions becomes wider toward its respective connecting portion.

9. A semiconductor device comprising:

a semiconductor substrate having a surface;

a plurality of source cells and a plurality of drain cells formed at the surface of the semiconductor substrate, said source and drain cells being alternately disposed along a plurality of columns and rows over said surface to form a grid;

a first insulating layer formed on the plurality of source cells and drain cells;

a first-layer source wiring formed into a first pectinate pattern to be electrically connected to the plurality of source cells through first source contacts formed on the first insulating layer on the plurality of source cells;

a first-layer drain wiring formed into a second pectinate pattern to be electrically connected to the plurality of drain cells through first drain contacts formed on the first insulating layer on the plurality of drain cells, wherein the first pectinate pattern of the first-layer source wiring and the second pectinate pattern of the first-layer drain wiring together form a first-layer wiring pattern;

a second insulating layer formed on the first layer wiring pattern to cover said first-layer source wiring and said first-layer drain wiring, said second insulating layer having second source contacts, second drain contacts, and first and second peripheral contacts;

a second-layer source wiring formed on the second insulating layer into a third pectinate pattern which is disposed at a specified angle to the first pectinate pattern of the first-layer source wiring; and a second-layer drain wiring formed on the second insulating layer into a fourth pectinate pattern which is disposed at the specified angle to the second pectinate pattern of the first-layer drain wiring, wherein the third pectinate pattern of the second-layer source wiring and the fourth pectinate pattern of the second-layer drain wiring together form a second-layer wiring pattern, wherein said first peripheral contact is formed in said second insulating layer at a position where a connecting portion of said second-layer source wiring overlaps a connecting portion of said first-layer source wiring, and said second peripheral contact is formed in said second insulating layer at a position where a connecting portion of said second-layer drain wiring overlaps a connecting portion of said first-layer drain wiring, and wherein the first-layer source wiring and the second-layer source wiring are electrically connected to each other through said second source contacts formed on the second insulating layer at intersections of the first-layer source wiring and the second-layer source wiring and through said first peripheral contact outside an area where said source cells and said drain cells are disposed, and the first layer drain wiring and the second-layer drain wiring are electrically connected through said second drain contacts formed on the second insulating layer at intersections of the first-layer drain wiring and the second-layer drain wiring and through said second peripheral contact outside said area where said source cells and said drain cells are disposed.

10. The semiconductor device of claim 9, wherein the specified angle made by the first-layer wiring pattern and the second-layer wiring pattern is 45 degrees.

11. A semiconductor device according to claim 9, wherein said first peripheral contact is formed along a periphery of each of said connecting portions of said first-layer source wiring and said second-layer source wiring.

12. A semiconductor device according to claim 11, wherein said second peripheral contact is formed along a periphery of each of said connecting portions of said first-layer drain wiring and said second-layer drain wiring.

13. A semiconductor device according to claim 9, wherein said third and fourth pectinate patterns have tooth portions connected by said connecting portions, respectively, and wherein said tooth portions are formed into shapes in which a width of each of said tooth portions becomes wider toward its respective connecting portion.

14. A semiconductor device comprising:

a semiconductor substrate having a surface;

a plurality of source cells and a plurality of drain cells formed at the surface of the semiconductor substrate, said source and drain cells being alternately disposed along a plurality of columns and rows over said surface to form a grid;

a first insulating layer formed on the plurality of source cells and drain cells;

a first-layer source wiring formed into a first pectinate pattern to be electrically connected to the plurality of source cells through first source contacts formed on the first insulating layer on the plurality of source cells, said first-layer source wiring having a first pad portion as a terminal which extends from said first pectinate pattern;

a first-layer drain wiring formed into a second pectinate pattern to be electrically connected to the plurality of drain cells through first drain contacts formed on the first insulating layer on the plurality of drain cells, said first-layer drain wiring having a second pad portion as a terminal which extends from said second pectinate portion, wherein the first pectinate pattern of the first-layer source wiring and the second pectinate pattern of the first-layer drain wiring together form a first-layer wiring pattern;

a second insulating layer formed on the first layer wiring pattern to cover said first-layer source wiring and said first-layer drain wiring, said second insulating layer having second source contacts, second drain contacts, and first and second pad contacts;

a second-layer source wiring formed on the second insulating layer into a third pectinate pattern which is disposed at a specified angle to the first pectinate pattern of the first-layer source wiring, said second-layer source wiring having a third pad portion as a terminal which extends from said third pectinate pattern; and a second-layer drain wiring formed on the second insulating layer into a fourth pectinate pattern which is disposed at the specified angle to the second pectinate pattern of the first-layer drain wiring, said second-layer drain wiring having a fourth pad portion as a terminal which extends from said fourth pectinate pattern, wherein the third pectinate pattern of the second-layer source wiring and the fourth pectinate pattern of the second-layer drain wiring together form a second-layer wiring pattern, wherein said first pad contact is formed in said second insulating layer at a position where said third pad portion of said third pectinate pattern overlaps with said first pad portion of said first pectinate pattern, and said second pad contact is formed in said second insulating layer at a position where said fourth pad portion of said fourth pectinate pattern overlaps with said second pad portion of said second pectinate pattern, and wherein the first-layer source wiring and the second-layer source wiring are electrically connected to each other through second source contacts formed on the second insulating layer at intersections of the first-layer source wiring and the second-layer source wiring and through said first pad contact, and the first layer drain wiring and the second-layer drain wiring are electrically connected through second drain contacts formed on the second insulating layer at intersections of the first-layer drain wiring and the second-layer drain wiring and through said second pad contact.

15. The semiconductor device of claim 14, wherein the specified angle made by the first-layer wiring pattern and the second-layer wiring pattern is 45 degrees.

16. A semiconductor device according to claim 14, wherein said third and fourth pectinate patterns have tooth portions connected by connecting portions, respectively, and wherein said tooth portions are formed into shapes in which a width of each of said tooth portions becomes wider toward its respective connecting portion.

* * * * *